(12) United States Patent
Wei et al.

(10) Patent No.: US 8,102,282 B2
(45) Date of Patent: Jan. 24, 2012

(54) ENCODING AND DECODING METHOD FOR MICRODOT MATRIX

(75) Inventors: Shou Te Wei, Hsin-Chu (TW); Chang Che Tsai, Hsin-Chu (TW)

(73) Assignee: Pixart Imaging Inc., Hsin-Chu County (TW)

( * ) Notice: Subject to any disclaimer, the term of this patent is extended or adjusted under 35 U.S.C. 154(b) by 39 days.

(21) Appl. No.: 12/719,969

(22) Filed: Mar. 9, 2010

(65) Prior Publication Data

US 2010/0231420 A1 Sep. 16, 2010

(30) Foreign Application Priority Data

Mar. 10, 2009 (TW) .............................. 98107613 A

(51) Int. Cl.
*H03M 1/22* (2006.01)
(52) U.S. Cl. .......................................... 341/5; 235/460

(58) Field of Classification Search ................ 341/5–50; 235/470–494
See application file for complete search history.

(56) References Cited

U.S. PATENT DOCUMENTS

2004/0035935 A1* 2/2004 Takahashi et al. ....... 235/462.09
* cited by examiner

*Primary Examiner* — Lam T Mai

(57) ABSTRACT

An encoding and decoding method for a microdot matrix includes the steps of: forming a plurality of microdots by encoding based on Reflected Gray Codes in a data region included in each of a plurality of microdot blocks included in a microdot matrix, wherein the microdots corresponding to lower order bits of the Reflected Gray Codes are formed as the outmost microdots in the data region; scanning the microdot matrix to fetch an image and recognizing a microdot group in the date region of each microdot block in the image; and decoding a corresponded coordinate of the image on the microdot matrix according to the microdot block to which the microdot group containing lower order bits of the Reflected Gray Codes belongs.

20 Claims, 13 Drawing Sheets

G0 0000
G1 0001  even to odd=>change the least significant bit
G2 0011  odd to even=>change the next-to-left bit of the bit 1 rightmost
G3 0010  even to odd=>change the least significant bit
G4 0110  odd to even=>change the next-to-left bit of the bit 1 rightmost
G5 0111  even to odd=>change the least significant bit
G6 0101  odd to even=>change the next-to-left bit of the bit 1 rightmost
G7 0100  even to odd=>change the least significant bit
G8 1100  odd to even=>change the next-to-left bit of the bit 1 rightmost
G9 1101  even to odd=>change the least significant bit
G10 1111 odd to even=>change the next-to-left bit of the bit 1 rightmost
G11 1110 even to odd=>change the least significant bit
G12 1010 odd to even=>change the next-to-left bit of the bit 1 rightmost
G13 1011 even to odd=>change the least significant bit
G14 1001 odd to even=>change the next-to-left bit of the bit 1 rightmost
G15 1000 even to odd=>change the least significant bit

FIG 3

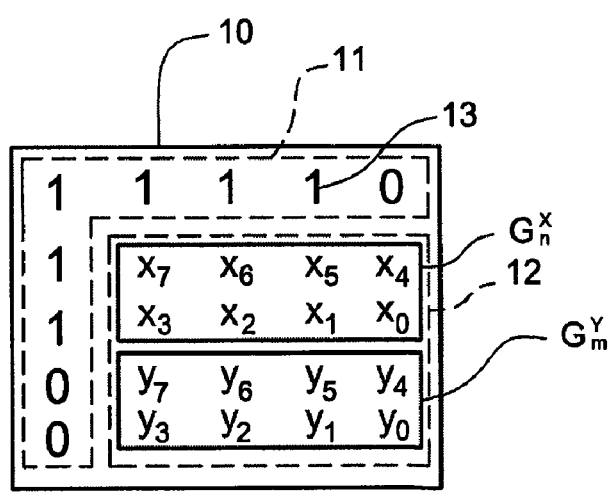

FIG 4

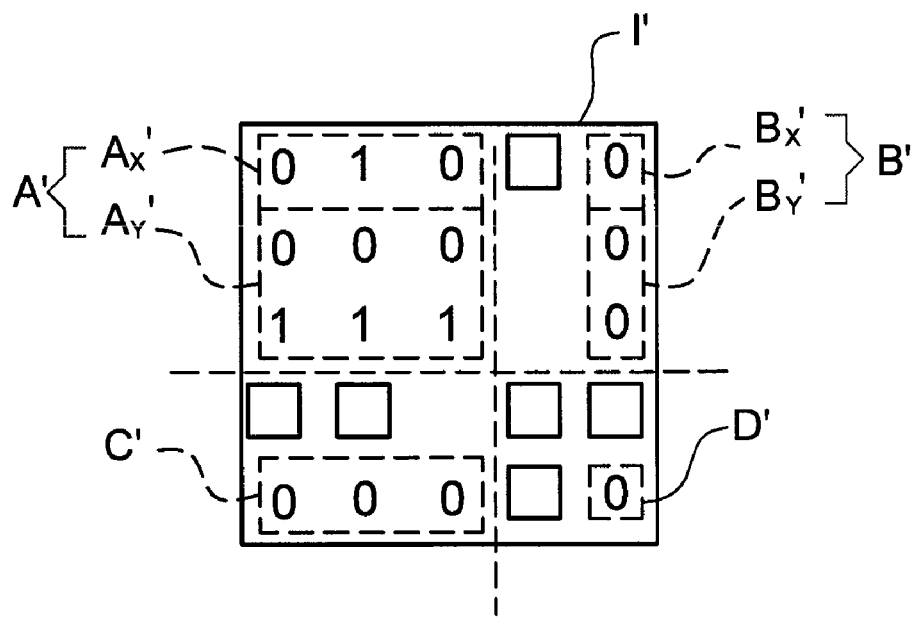
FIG 7b
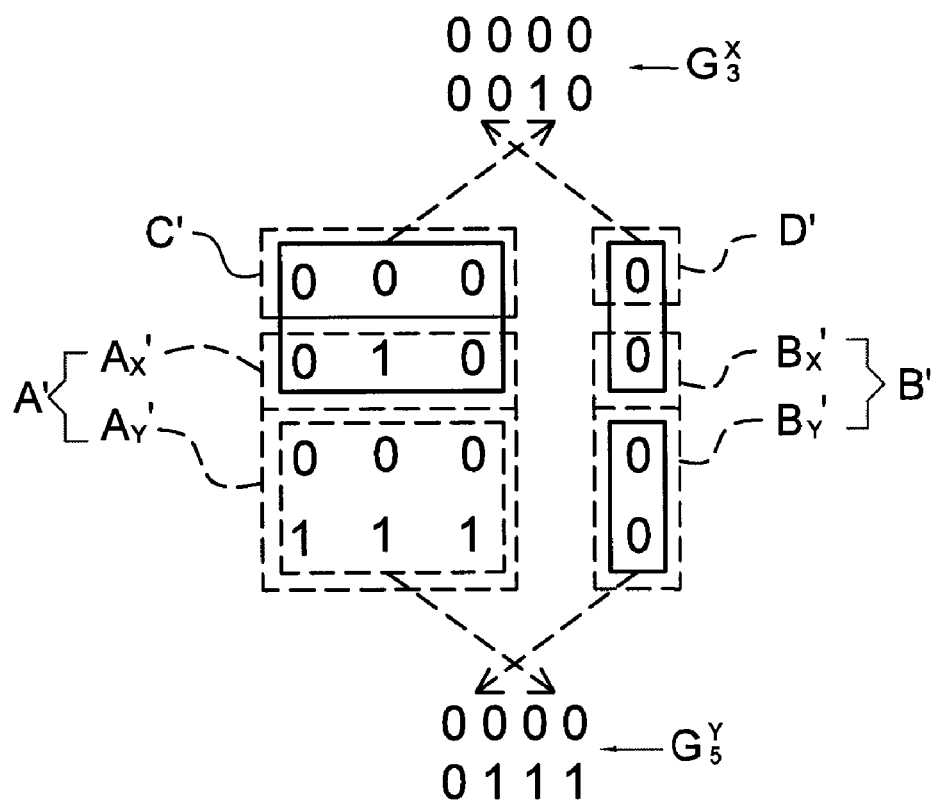

FIG 14a

| | | | |
|---|---|---|---|
| $x_3$ | $x_4$ | $x_7$ | $y_7$ |
| $x_2$ | $y_5$ | $x_6$ | $y_6$ |
| $x_1$ | $y_3$ | $x_5$ | $y_4$ |
| $x_0$ | $y_0$ | $y_1$ | $y_2$ |

| | | | |
|---|---|---|---|
| $x_3$ | $x_6$ | $x_7$ | $y_7$ |
| $x_2$ | $x_5$ | $y_5$ | $y_6$ |
| $x_1$ | $x_4$ | $y_3$ | $y_4$ |
| $x_0$ | $y_0$ | $y_1$ | $y_2$ |

| | | | |
|---|---|---|---|
| $x_3$ | $x_4$ | $x_5$ | $x_6$ |
| $x_2$ | $y_6$ | $y_7$ | $x_7$ |
| $x_1$ | $y_3$ | $y_4$ | $y_5$ |
| $x_0$ | $y_0$ | $y_1$ | $y_2$ |

$G_n^{X'}$, $G_m^{Y'}$

US 8,102,282 B2

ENCODING AND DECODING METHOD FOR MICRODOT MATRIX

CROSS REFERENCE TO RELATED APPLICATION

This application claims the priority benefit of Taiwan Patent Application Serial Number 098107613, filed on Mar. 10, 2009, the full disclosure of which is incorporated herein by reference.

BACKGROUND

1. Field of the Invention

This invention generally relates to an encoding and decoding method and, more particularly, to an encoding and decoding method for a microdot matrix.

2. Description of the Related Art

Please refer to FIG. 1, it shows a conventional handwriting recognition system including a read/write medium 91 and a scanning device 92. A microdot matrix, which includes a plurality of visually negligible position codes 911, is formed on the read/write medium 91.

Please refer to FIGS. 2a and 2b, each position code 911 generally includes a header region 9111 and a data region 9112, wherein microdots 9113 distributed with different combinations and permutations are formed in the data region 9112 of every position codes 911 whereas microdots 9113 distributed in a fixed combination and permutation are formed in the header region 9111 of every position codes 911. In FIG. 2b, the microdots 9113 included in the position code 911 shown in FIG. 2a are replaced by the binary bits, i.e. positions with a microdot 9113 therein are replaced with the binary bit "1" and positions without a microdot 9113 therein are replaced with the binary bit "0".

The scanning device 92 has an image sensor 921 for fetching images of the position codes 911. In this manner, a user may utilize the scanning device 92 to write on the read/write medium 91, and a processing unit will compare the image of the data region 9112 of the position code 911 fetched by the image sensor 921 with a data base so as to recognize a current position and motion of the scanning device 92. However, the conventional handwriting recognition system has at least following problems: (1) A large memory space is required to store all position codes 911 on a microdot matrix for being compared with the fetched images by a processing unit; and (2) The image sensor 921 has to fetch an image including at least one complete position code 911 at any moment for image comparison, and thus the image sensor 921 requires a larger sensor array. However, these system requirements will increase the system cost of a handwriting recognition system.

Accordingly, the present invention provides an encoding and decoding method for a microdot matrix that performs the encoding and decoding based on Reflected Gray Codes so as to reduce system requirements and to eliminate the position ambiguity during decoding process.

SUMMARY

The present invention provides an encoding and decoding method for a microdot matrix that encodes and decodes a microdot matrix based on Reflected Gray Codes and the microdots corresponding to lower order bits of the Reflected Gray Codes are formed together as the outmost microdots in the microdot block thereby reducing the ambiguity generated during decoding.

The present invention further provides an encoding and decoding method for a microdot matrix that encodes and decodes a microdot matrix based on Reflected Gray Codes so as to simplify the decoding procedure.

The present invention provides an encoding method for a microdot matrix including: forming a plurality of microdots by encoding based on Reflected Gray Codes in a data region included in each of a plurality of microdot blocks included in a microdot matrix, wherein the microdots corresponding to lower order bits of the Reflected Gray Codes are formed as the outmost microdots in the data region.

The present invention further provides a decoding method for a microdot matrix. The microdot matrix includes a plurality of microdot blocks each including a header region and a date region. A plurality of microdots are formed by encoding based on Reflected Gray Codes in the date region to generate at least one direction coordinate code. The decoding method includes the steps of: scanning the microdot matrix to fetch an image; recognizing whether the image contains a complete direction coordinate code; determining a coordinate of the image on the microdot matrix by decoding the direction coordinate code when the image contains a complete direction coordinate code; and performing the following steps when the image does not contain a complete direction coordinate code: dividing the image into a plurality of microdot groups according to the header region of each microdot block; forming the microdot groups belonging to identical direction coordinate code in two adjacent columns as an afore-arranged coordinate code according to the header region of each microdot block; switching positions of the microdot groups belonging to different microdot blocks in the afore-arranged coordinate code to form an after-arranged coordinate code; and determining a coordinate of the image on the microdot matrix according to the after-arranged coordinate code.

The present invention further provides a decoding method for a microdot matrix. The microdot matrix includes a plurality of microdot blocks each including a header region and a data region. A plurality of microdots are formed by encoding based on Reflected Gray Codes in the date region to generate at least one direction coordinate code. The microdots corresponding to lower order bits of the Reflected Gray Codes are formed as the outmost microdots in the direction coordinate code. The decoding method includes the steps of: scanning the microdot matrix to fetch an image; recognizing whether the image contains a complete direction coordinate code; determining a coordinate of the image on the microdot matrix by decoding the direction coordinate code when the image contains a complete direction coordinate code; and performing the following steps when the image dose not contain a complete direction coordinate code: dividing the image into a plurality of microdot groups according to the header region of each microdot block; and using the direction coordinate code of the microdot block to which the microdot group including lower order bits of the Reflected Gray Codes belongs as a coordinate of the image on the microdot matrix.

The present invention further provides a decoding method for a microdot matrix. The microdot matrix includes a plurality of microdot blocks. A plurality of microdots are formed by encoding based on Reflected Gray Codes in a data region included in the microdot block, and the microdots corresponding to lower order bits of the Reflected Gray Codes are formed as the outmost microdots in the data region. The decoding method includes the steps of: scanning the microdot matrix to fetch an image and recognizing a microdot group in the date region of each microdot block in the image; and decoding a coordinate of the image on the microdot matrix according to the microdot block to which the microdot group containing lower order bits of the Reflected Gray Codes belongs.

The present invention further provides an encoding and decoding method for a microdot matrix including the steps of: forming a plurality of microdots by encoding based on Reflected Gray Codes in a data region included in each of a plurality of microdot blocks included in a microdot matrix, wherein the microdots corresponding to lower order bits of the Reflected Gray Codes are formed as the outmost microdots in the data region; scanning the microdot matrix to fetch an image and recognizing a microdot group in the date region of each microdot block in the image; and decoding a coordinate of the image on the microdot matrix according to the microdot block to which the microdot group containing lower order bits of the Reflected Gray Codes belongs.

The encoding and decoding method for a microdot matrix of the present invention performs the encoding and decoding of position codes based on the regular pattern of the Reflected Gray Codes, such that it is not necessary to incorporate a memory to record all position codes on a read/write medium. Furthermore, the microdots corresponding to lower order bits of the Reflected Gray Codes are formed as the outmost microdots in the data region so as to reduce the position ambiguity during decoding, and the position ambiguity during decoding may be eliminated by checking a balancing bit in the header region. In the present invention, it is able to further determine several position scales according to a distance between a center of the image fetched by the image sensor and a center of the microdot block to which the decoded image belongs so as to increase the position resolution of the decoding method for a microdot matrix.

BRIEF DESCRIPTION OF THE DRAWINGS

Other objects, advantages, and novel features of the present invention will become more apparent from the following detailed description when taken in conjunction with the accompanying drawings.

FIG. 3 shows a schematic diagram for generating a Reflected Gray Code.

FIG. 4 shows a schematic diagram of encoding a data region based on Reflected Gray Codes in an embodiment of the present invention.

FIG. 7b shows another schematic diagram of a decoding method for a microdot matrix according to an embodiment of the present invention.

FIGS. 14a~14c respectively show an encoding method for a microdot matrix according to an alternative embodiment of the present invention.

DETAILED DESCRIPTION OF THE EMBODIMENT

It should be noticed that, wherever possible, the same reference numbers will be used throughout the drawings to refer to the same or like parts.

First, the properties and generating method of a set of Reflected Gray Code will be illustrated. Please refer to FIG. 3, it shows a generating method of a 4-bit Gray code. Basic properties of Reflected Gray Code include: (1) Reflected Gray Codes corresponding to two consecutive inter values differ in only one bit, i.e. the hamming distance between two consecutive Reflected Gray Codes is 1; one of the two consecutive Reflected Gray Codes is an odd Reflected Gray Code and the other is an even Reflected Gray Code, wherein an odd Reflected Gray Code includes an odd number of bits 1 whereas an even Reflected Gray Code includes an even number of bits 1; (2) While incrementing a value of an even Reflected Gray Code by 1 to generate an odd Reflected Gray Code having the incremented value, the odd Reflected Gray Code can be generated only by changing the least significant bit of the even Reflected Gray Code; and (3) While incrementing a value of an odd Reflected Gray Code by 1 to generate an even Reflected Gray Code having the incremented value, the even Reflected Gray Code can be generated only by changing the next-to-left bit of the bit 1 rightmost in the odd Reflected Gray Code. In order to clearly show the reflective properties in Reflected Gray Codes in FIG. 3, a plurality of horizontal lines are shown to divide the Reflected Gray Codes into different sets; wherein each horizontal line in FIG. 3 serves as a virtual mirror for symmetric Reflected Gray Codes located at the upper and lower sides thereof, and two symmetric Reflected Gray Codes merely differ in the leftmost bit 1 of one of the symmetric Reflected Gray Codes. Note that the above virtual mirror should be known for those who skilled in related art of Reflected Gray Code and thus details will not be repeated herein. In addition, a person skilled in the art can generate a N-bit Reflected Gray Code according to the same process, e.g. 8-bit Gray code.

Figure 1:
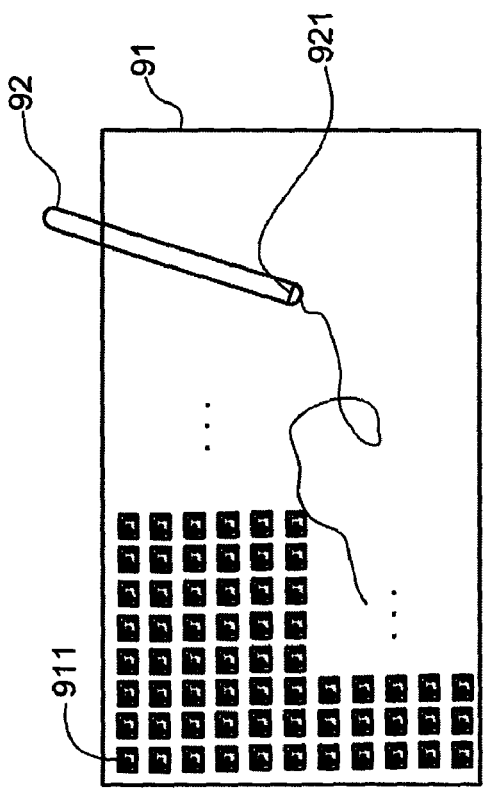
FIG. 1 shows a schematic diagram of a conventional handwriting recognition system.
Figure 2B:
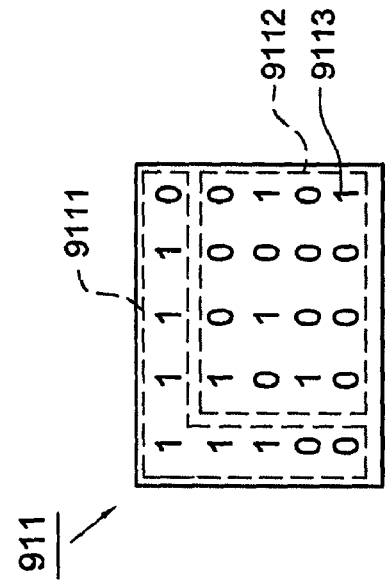
FIG. 2b shows another schematic diagram of the position code shown in FIG. 2a, wherein microdots are represented by the binary bit.
Figure 2A:
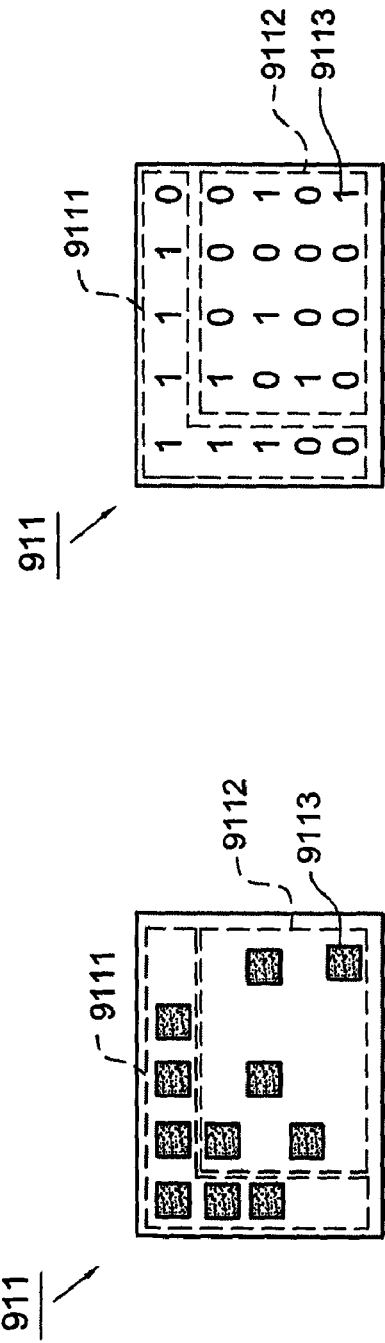
FIG. 2a shows a schematic diagram of a position code in a conventional handwriting recognition system.
Figure 5:
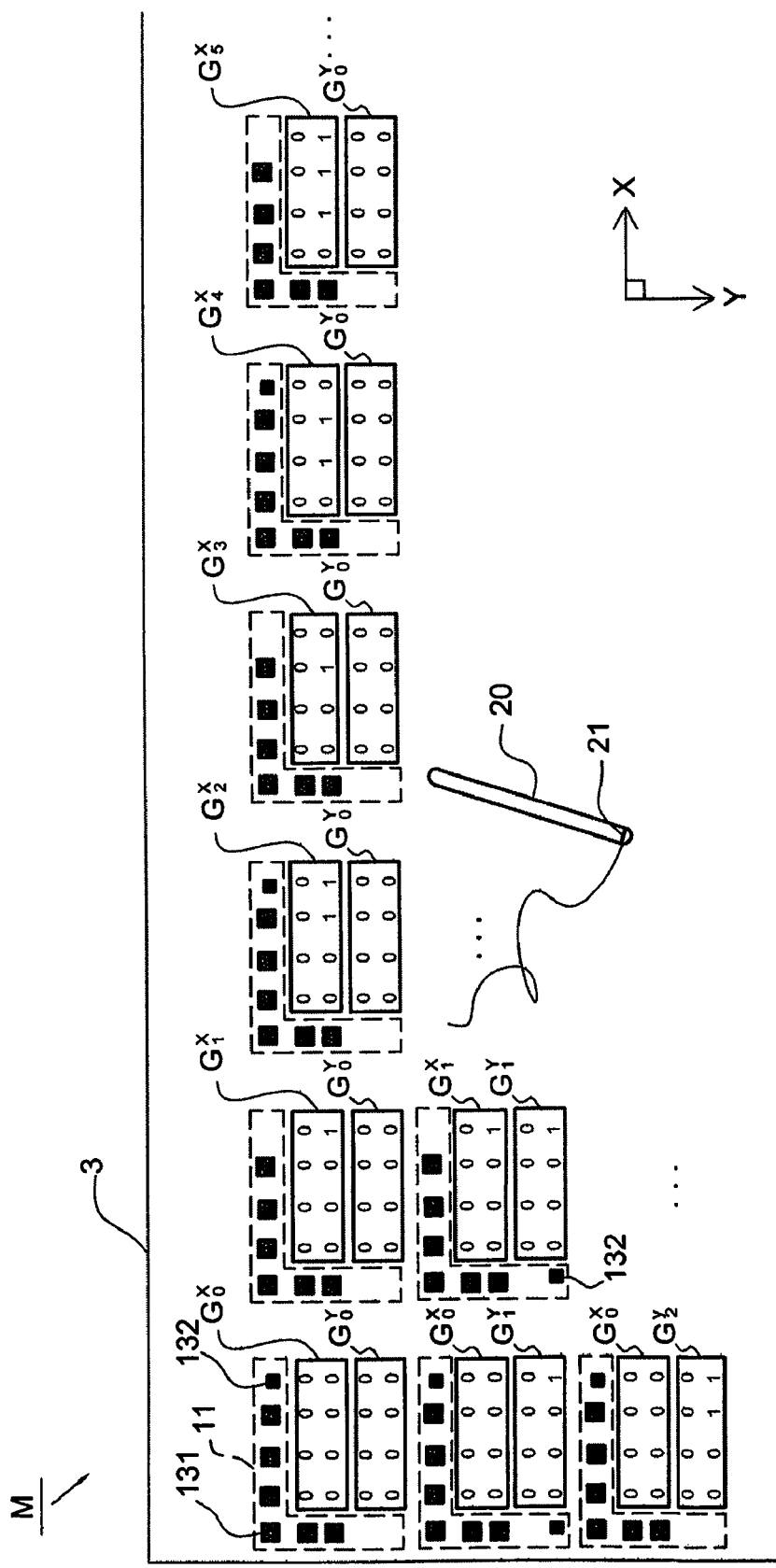
FIG. 5 shows a schematic diagram of an encoding method for a microdot matrix according to an embodiment of the present invention.

Please refer to FIGS. 4 to 5, they schematically show a microdot block 10 and a microdot matrix M according to an embodiment of the present invention. A plurality of microdot blocks 10 are distributed on a read/write medium 3 to form the microdot matrix M (as shown in FIG. 5), and each microdot block 10 is for indicating a different coordinate on the microdot matrix M. The microdot block 10 includes a header region 11 and a data region 12, wherein an arbitrary shape of a microdot 13, for example, but not limited to, rectangular microdot, circular microdot, triangular microdot, minus sign microdot or plus sign microdot, may be formed at positions showing digital bit "1" in the header region 11 and the data region 12; whereas positions showing digital bit "0" may be blank. However, the above arrangement may be reversed, i.e. positions showing digital bit "1" may be blank while an arbitrary shape of microdot 13 may be formed at positions showing digital bit "0". In addition to representing digital bits "1" and "0" by the presence and absence of the microdots 13, the digital bits "1" and "0" may also be represented by different sizes, shapes or locations of the microdot 13. That is, any method that can form two distinguishable microdots 13 is not apart from the scope of the present invention.

The header region 11 of each microdot block 10 includes header microdots 131 distributed in a fixed combination and permutation and a balancing microdot 132 representing a coordinate value of different directions, wherein the balancing microdot 132 is for coordinate correction and it may not be implemented 132 according to different embodiments. The data region 12 of every microdot blocks 10 includes microdots 13 formed as a matrix and with different combinations and permutations for recognition. In this manner, it is able to recognize the coordinate or the position of each microdot block 10 on the microdot matrix M according to the distribution of the microdots 13 formed in the data region 12. In this embodiment, the data region 12 includes an X-coordinate code $G_n^X$ and a Y-coordinate code $G_n^Y$, wherein the X-coordinate code $G_n^X$ is formed by a 8-bit Reflected Gray Codes $x_0$~$x_7$, and $x_0$ represents the least significant bit of the X-coordinate code $G_n^X$ while $x_7$ represents the highest significant bit of the X-coordinate code $G_n^X$; the Y-coordinate code $G_m^Y$ is also formed by a 8-bit Reflected Gray Codes $y_0$~$y_7$, and $y_0$ represents the least significant bit of the Y-coordinate code $G_m^Y$ while $y_7$ represents the highest significant bit of the Y-coordinate code $G_m^Y$. In this embodiment, a microdot 13 may be formed at the positions representing the digital bit "1" of the Reflected Gray Code while the positions representing the digital bit "0" of the Reflected Gray Code may be blank. The X-coordinate code $G_n^X$ represents the nth coordinate along the X-coordinate axis on the microdot matrix M while the Y-coordinate code $G_m^Y$ represents the mth coordinate along the Y-coordinate axis on the microdot matrix M, wherein the X-coordinate axis is perpendicular to the Y-coordinate axis. In other embodiment, the X-coordinate code $G_n^X$ and the Y-coordinate code $G_m^Y$ may be formed by the Reflected Gray Codes having other number of bits, e.g. 16-bit or 32-bit Reflected Gray Codes, according to the size of the microdot matrix M.

Please refer to FIG. 5 again, it shows a schematic diagram of a microdot matrix M formed by using the microdot blocks 10 shown in FIG. 4. It should be understood that, in order to clearly show the characteristics of the microdot block 10 in FIG. 5, the size of every microdot blocks 10 and a distance between microdot blocks 10 are enlarged. In actual implementation, the microdot blocks 10 are formed closely with each other and the size of the microdot blocks 10 is small enough to be visually neglected. On the microdot matrix M, the X-coordinate codes $G_n^X$ of the microdot block 10 may be sequentially arranged from left to right or right to left (i.e. X-coordinate direction) while the Y-coordinate codes $G_m^Y$ may be arranged sequentially from up to down or down to up (i.e. Y-coordinate direction), wherein the "sequential arrangement" described herein is to arrange the XY coordinate codes in a sequence of $G_0$, $G_1$, $G_2$ . . . as shown in FIG. 3. For example as shown in FIG. 5, in the most upper-left microdot block 10 on the microdot matrix M, the X-coordinate code is arranged as $G_0^X$ ("00000000") and the Y-coordinate code is arranged as $G_0^Y$ ("00000000"), i.e. the coordinate of the most upper-left microdot block 10 on the microdot matrix M is arranged as (0,0). In the arrangement along the X-coordinate axis, the Gray code $G_1$, which is consecutive to the Gray code $G_0$ (as shown in FIG. 3), is arranged at the right hand side of the microdot block 10 with a coordinate (0,0), and thus the X-coordinate code of the microdot block 10 with a coordinate (1,0) is arranged as $G_1^X$ ("00000001"). Since the position of the microdot block 10 with the coordinate (1,0) is not changed along the Y-coordinate axis, the Y-coordinate code thereof is still arranged as $G_0^Y$ ("00000000"). Following this rule, the X-coordinate codes and the Y-coordinate codes of the microdot blocks 10 may be sequentially arranged along the right direction of FIG. 5 (i.e. X-coordinate axis direction). In the arrangement along the Y-coordinate axis, the Gray code $G_1$, which is consecutive to the Gray code $G_0$, is arranged below the microdot block 10 with the coordinate (0,0), and thus the Y-coordinate code of the microdot block 10 with a coordinate (0,1) is arranged as $G_1^Y$ ("00000001"). Since the position of the microdot block 10 with the coordinate (0,1) is not changed along the X-coordinate axis, the X-coordinate code thereof is still arranged as $G_0^X$ ("00000000"). Following this rule, the X-coordinate codes and the Y-coordinate codes of the microdot blocks 10 may be sequentially arranged along the downward direction of FIG. 5 (i.e. Y-coordinate axis direction). In this manner, a plane coordinate system can be formed and each microdot block 10 in the plane coordinate system has an individual coordinate (n,m). Accordingly, when an image sensor 21 of a scanning device 20 fetches the complete image of each microdot block 10, a processing unit (not shown) may recognize the coordinate (n,m) of the current image fetched by the scanning device 20 on the microdot matrix M according to the X-coordinate code $G_n^X$ and the Y-coordinate code $G_m^Y$, and recognizes the motion of the scanning device 20 according to successive images fetched by the scanning device 20.

The header microdots 131 in the header region 11 of every microdot blocks 10 are distributed in a fixed combination and permutation inside the header region 11. The balancing microdot 132 may be formed at the last position of the first row of the header region 11 every other column of the microdot matrix M for the coordinate correction along the X-coordinate axis, or at the last position of the first column of the header region 11 every other row of the microdot matrix M for the coordinate correction along the Y-coordinate axis, wherein the header microdots 131 and the balancing microdot 132 may have different patterns. As shown in FIG. 5, the X-coordinate codes $G_0^X$, $G_2^X$, $G_4^X$ . . . all include a balancing microdot 132 while the Y-coordinate codes $G_1^Y$ . . . also include a balancing microdot 132. However, the balancing microdot 132 may be formed in other ways, e.g. it may be formed at different corners or locations of the same position in the header region 11 of every microdot blocks 10 for simultaneously representing coordinate bits in two directions.

However, most of the images of the microdot matrix M fetched by the scanning device 20 may not contain a complete microdot block 10. The present invention also can recognize the coordinate of the image currently fetched by the scanning device 20 on the microdot matrix M according to a partial image of each microdot block 10.

Figure 6A:
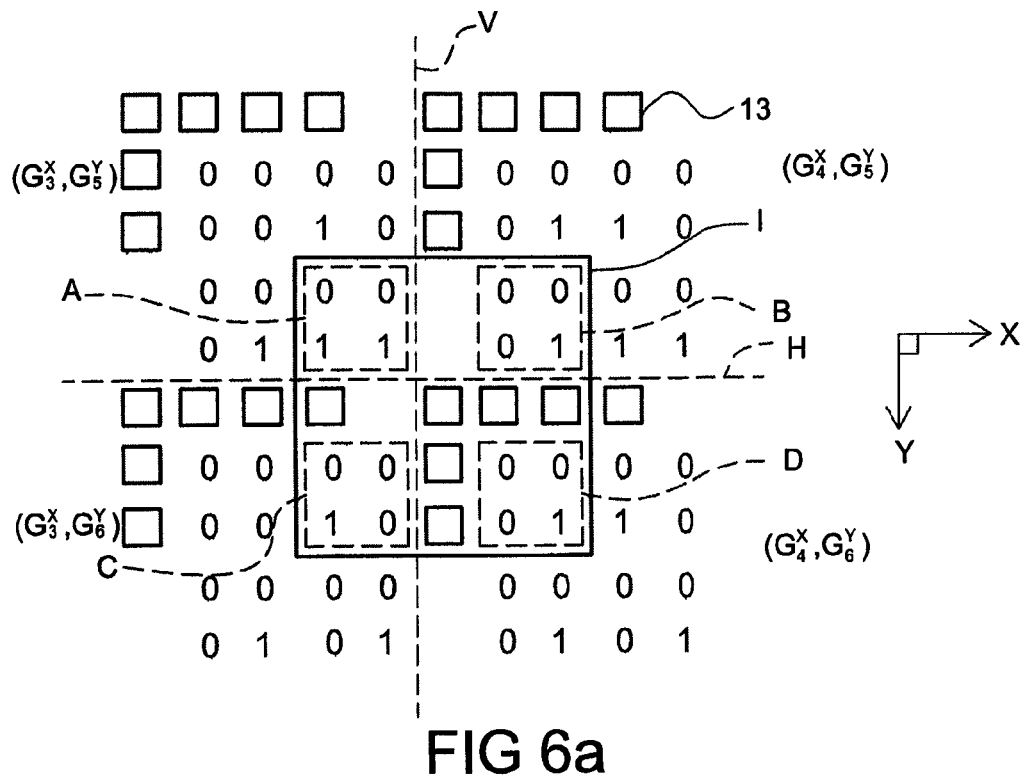
FIG. 6a shows a schematic diagram of a part of microdots of four adjacent microdot blocks fetched by an image sensor in an embodiment of the present invention.

The method to decode an image including a part of the microdots 13 of a plurality of microdot blocks 10 fetched by the image sensor 21 of the scanning device 20 will be illustrated hereinafter. Please refer to FIG. 6a, it shows four adjacent microdot blocks 10 and an image I, which includes a part of the microdots 13 of four microdot blocks 10, fetched by the image sensor 21. According to the Reflected Gray Codes shown in FIG. 3, it can be appreciated that, the coordinates of the microdot blocks 10 are respectively $(G_3^X, G_5^Y)$, $(G_4^X, G_5^Y)$, $(G_3^X, G_6^Y)$ and $(G_4^X, G_6^Y)$, wherein square microdots 13 are used to represent the digital bit "1" in the header region 11 of each microdot block 10 while the digital bits "1" and "0" are used to represent the coding of the date region 12. It should be appreciated that, the vertical dash line V and the horizontal dash line H shown in FIG. 6a are only for illustratively indicating the region of every microdot blocks 10, and the dash lines V and H will not be shown on the read-write medium 3 in actual implementation. In addition, for simplifying the drawing, the numerals of the microdot 10, the header region 11 and the data region 12 are omitted in FIG. 6a.

During decoding, at first a processing unit (not shown) will recognize different regions to which every microdot groups belong according to the header region 11 of each microdot block 10. For example in FIG. 6a, the image I includes four microdot groups A, B, C and D, and the microdot groups A and B belong to the Y-coordinate code and the microdot groups C and D belong to the X-coordinate code, wherein the microdot groups A and B refer to an afore-rearranged Y-coordinate code while the microdot groups C and D refer to an afore-rearranged X-coordinate code.

Figure 6B:
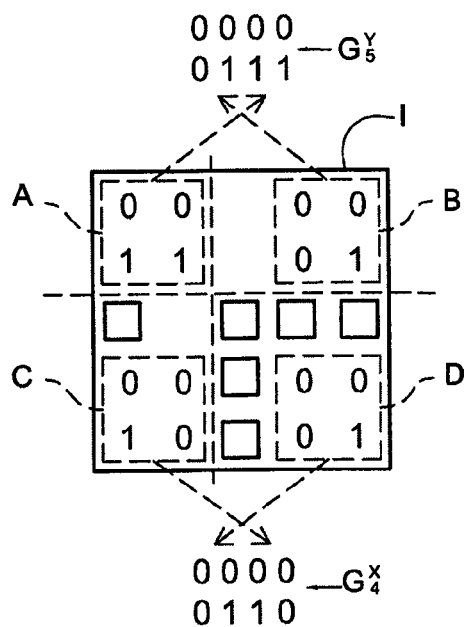
FIG. 6b shows a schematic diagram of a decoding method for a microdot matrix according to an embodiment of the present invention.

Next, please refer to FIG. 6b, it shows a schematic diagram of the decoding procedure performed by a processing unit according to the image I shown in FIG. 6a. In the X-coordinate code, positions of the microdot groups C and D are switched to generate an after-arranged X-coordinate code "00000110" that can be recognized as $G_4^X$ after decoding. In the Y-coordinate code, positions of the microdot groups A and B are switched to generate an after-arranged Y-coordinate code "00000111" that will be recognized as $G_5^Y$ after decoding. Finally the current coordinate of the image I fetched by the scanning device 20 may be recognized as (4,5) on the microdot matrix M. In this manner, in the encoding and deciding method for a microdot matrix of the present invention, since the Reflected Gray Codes have a varying regularity, it is not necessary to use a storage device to record large amounts of information of the position codes. It is able to recognize the coordinate of the image fetched by the image sensor 21 of the scanning device 20 on the microdot matrix M only by using an algorithm. Furthermore, the decoding method for a microdot matrix of the present invention may also recognize a plurality of incomplete microdot blocks 10 and perform coordinate recognition.

In the illustrations of FIGS. 6a and 6b, the image sensor 21 fetches a quarter of the microdots 13 of four microdot blocks 10 to perform decoding. When the image sensor 21 fetches different numbers of microdots 13 from the data region 12 of different microdot blocks 10, the aforementioned method also can be used to perform decoding. Please refer to FIG. 7a, it schematically shows that the image I shown in FIG. 6a moves a distance of one microdot 13 toward left-upper direction, and the image is referred as I' herein. Similarly, the image I' can be divided into four microdot groups A', B', C' and D' according to the header region 11 of each microdot block 10. The microdot group A' includes nine microdots 13 that are consisted of an X-coordinate microdot group $A_{X'}$ and a Y-coordinate microdot group $A_{Y'}$. The microdot group B' includes three microdots 13 that are consisted of an X-coordinate microdot group $B_{X'}$ and a Y-coordinate microdot group $B_{Y'}$. The microdot group C' includes three microdots 13 all belonging to Y-coordinate code. The microdot group D' includes one microdot 13 belonging to Y-coordinate code.

Figure 7A:
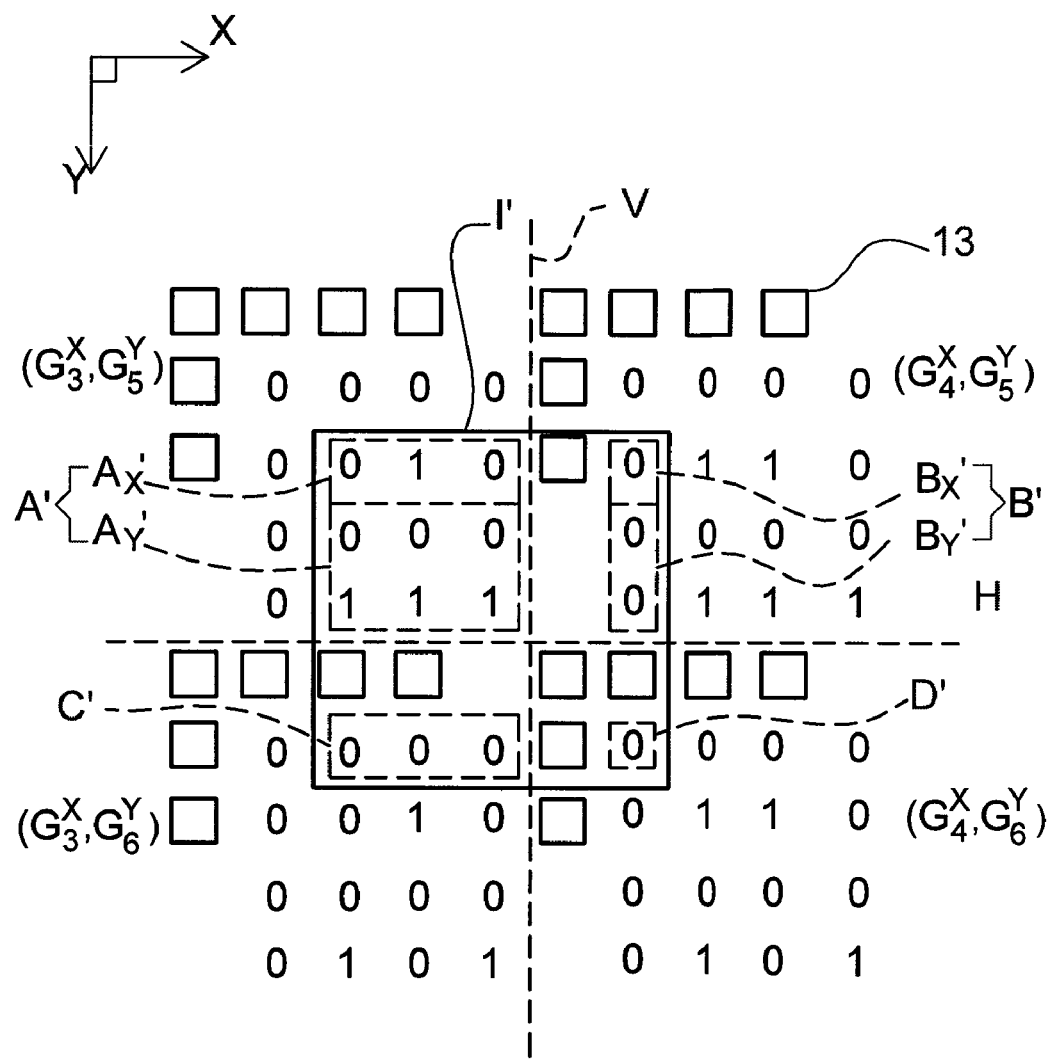
FIG. 7a shows another schematic diagram of a part of microdots of four adjacent microdot blocks fetched by an image sensor in an embodiment of the present invention.

Please refer to FIG. 7b, it shows a schematic diagram of the decoding procedure performed by a processing unit according to the image I' shown in FIG. 7a. In the X-coordinate code, at first the microdot groups C' and D' are recognized to belong to the first row of the X-coordinate code according to the header region 11 of the microdot blocks 10. Therefore, after recognition, the arrangement of the microdot groups A', B', C' and D' will be rearranged to become the one shown in the lower part of FIG. 7b, i.e. the afore-arranged coordinate codes. Next, following the aforementioned method, positions of the microdot groups D', $B_{X'}$ and positions of the microdot groups C', $A_{X'}$ in the X-coordinate core are switched to generate an after-arranged X-coordinate code "00000010" that will be recognized as $G_3^X$ after decoding. In the Y-coordinate code, a position of the microdot group $B_{Y'}$ and a position of the microdot group $A_{Y'}$ are switched to generate an after-arranged Y-coordinate code "00000111" that will be recognized as $G_5^X$ after decoding. Finally, the current coordinate of the image I' fetched by the image sensor 20 may be recognized as (3,5) on the microdot matrix M. In addition, if the image sensor 21 fetches four different microdot groups, the above method still can be used to perform decoding process.

Figure 8A:
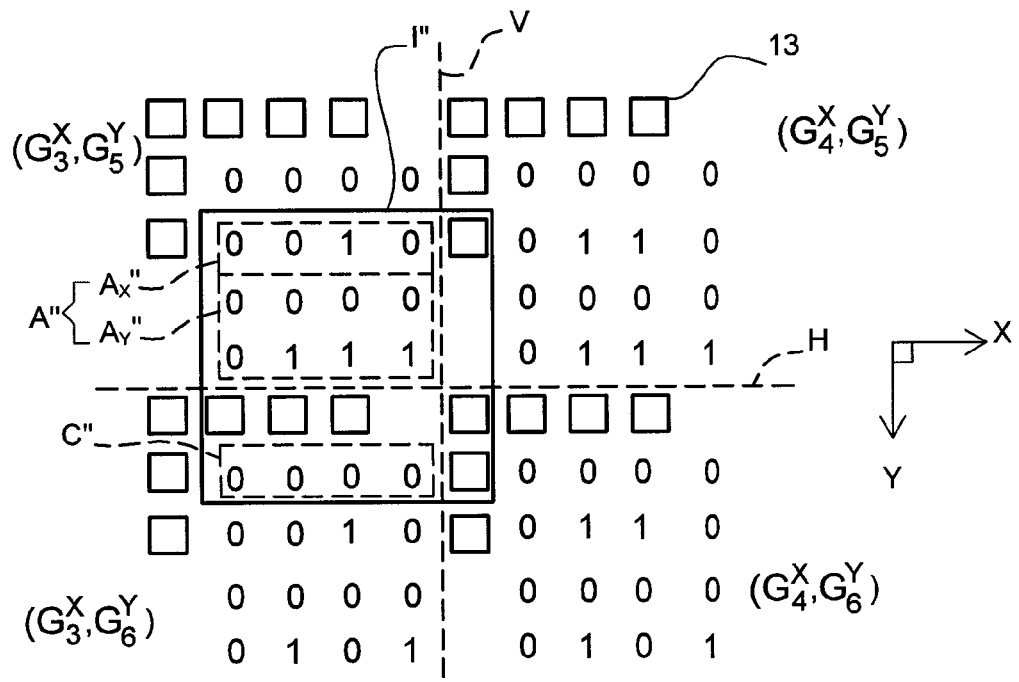
FIG. 8a shows another schematic diagram of a part of microdots of two adjacent microdot blocks fetched by an image sensor in an embodiment of the present invention.

In another embodiment, the image sensor 21 may only fetch two vertically adjacent microdot blocks 10 and at this moment the coordinate can be recognized directly according to the X-coordinate code and the Y-coordinate code. For example, please refer to FIG. 8a, it shows a schematic diagram of an image I" fetched by the image sensor 21, wherein the image I" includes a microdot group A" and a microdot group C". According to the header region 11 of every microdot blocks 10 fetched, it is able to recognize that the microdot group A" includes an X-coordinate microdot group $A_{X}$" and a Y-coordinate microdot group $A_{Y}$". According to the header region 11 of every microdot blocks 10 fetched, it is able to recognize that the microdot group C" belongs to the first row of the X-coordinate code, and thus the image I" includes a complete X-coordinate code that is consisted of the microdot groups C" and $A_{X}$". In this manner, the X-coordinate code can be rearranged as "00000010" that will be recognized as $G_3^X$ after decoding. Similarly, since the image I" includes a complete Y-coordinate code, i.e. the microdot group $A_{Y}$", the Y-coordinate code can be directly rearranged as "00000111" that that will be recognized as $G_5^Y$ after decoding.

In another embodiment, the image sensor 21 may only fetch two horizontally adjacent microdot blocks 10. At this moment, the XY coordinates also can be obtained by using similar method.

Figure 8B:
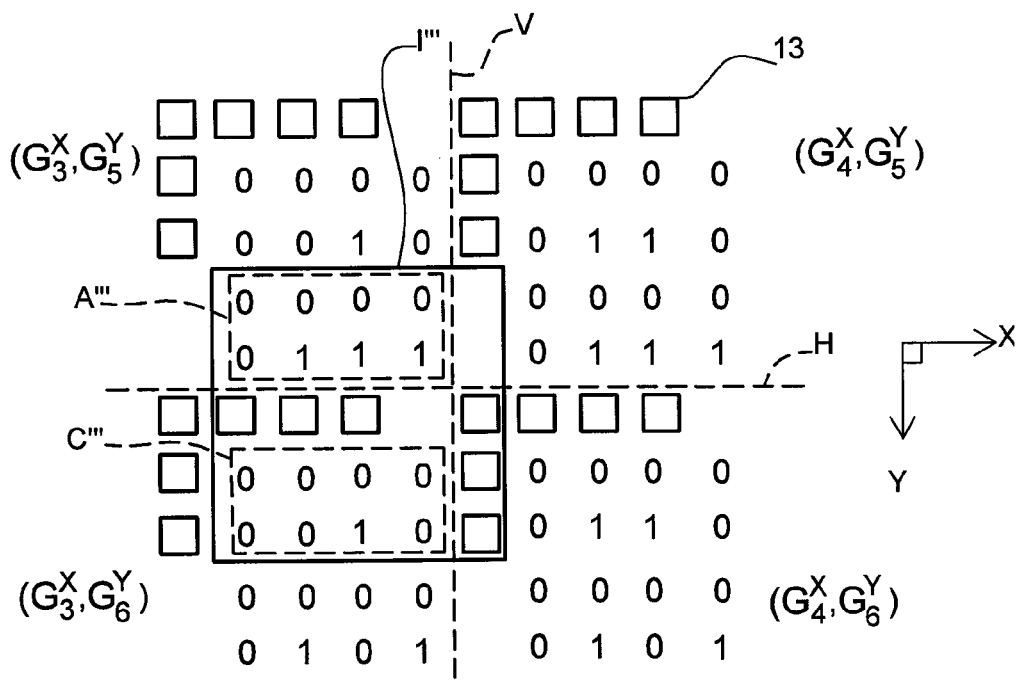
FIG. 8b shows another schematic diagram of a part of microdots of two adjacent microdot blocks fetched by an image sensor in an embodiment of the present invention.

Please refer to FIG. 8b, in another embodiment the image sensor 21 fetches an image I''' that includes a microdot group A''' and a microdot group C'''. At this moment, since the image I''' includes a complete X-coordinate code, i.e. the microdot group A''', and a complete Y-coordinate code, i.e. the microdot group C''', it is able to directly recognize that the X-coordinate code is $G_3^X$ and the Y-coordinate code is $G_5^Y$.

Figure 9:
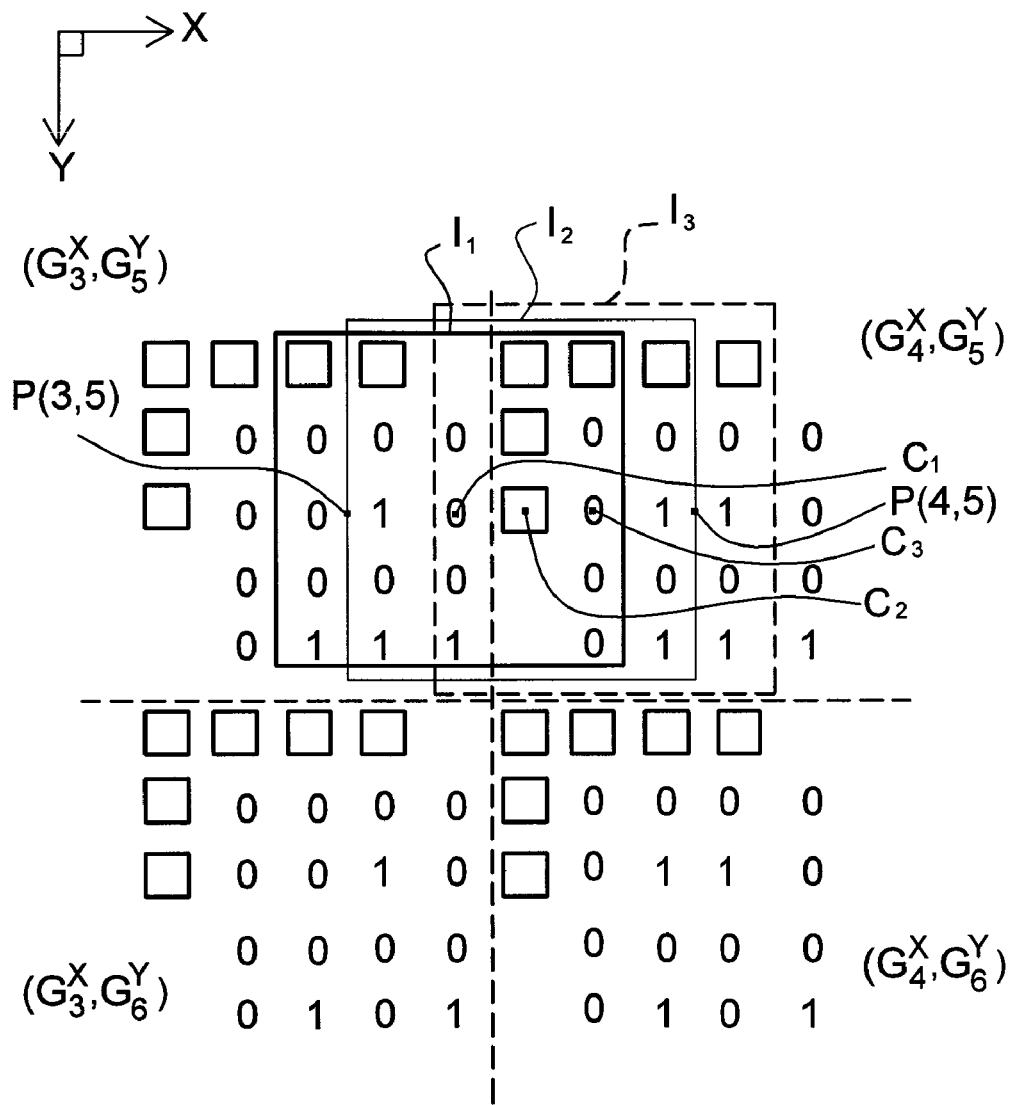
FIG. 9 shows a schematic diagram of a method for increasing the resolution of the decoding method for a microdot matrix according to an embodiment of the present invention.

Furthermore, in order to increase the accuracy of position recognition, in the encoding and decoding method for a microdot matrix of the present invention, three scales may further be divided between two adjacent microdot coordinates on the microdot matrix M according to a distance between the center of the image I and the coordinate of the microdot matrix M to which the image I belongs. The defining method will be explained according to FIG. 9, which shows a schematic diagram of the images of different position codes 13 fetched by the image sensor 21. For simplification, the explanation will be made only in the X direction and the division method in the Y direction is similar to that in the X direction. In FIG. 9, it is assumed that the center of the microdot block 10 with a coordinate (3,5) is P(3,5) and the center of the microdot block 10 with a coordinate (4,5) is P(4,5). When the image sensor 21 fetches an image $I_1$, the X-coordinate code can be rearranged according to the above method as "00000010", and thus the coordinate of the image $I_1$ is recognized as (3,5). At this moment, a coordinate scale may be determined according to a distance between the center $C_1$ of the image $I_1$ and the point P(3,5). When the image sensor 21 fetches an image $I_2$, the X-coordinate code can be rearranged according to the above method as "00000110", and thus the coordinate of the image $I_1$ is recognized as (4,5). At this moment, another coordinate scale may be determined according to a distance between the center $C_2$ of the image $I_2$ and the point P(4,5). When the image sensor 21 fetches an image $I_3$, the X-coordinate code can be rearranged according to the above method as "00000110", and thus the coordinate of the image $I_3$ is recognized as (4,5). At this moment, another coordinate scale can further be determined according to a distance between the center $C_3$ of the image $I_3$ and the point P(4,5). In this manner, the accuracy of position recognition during decoding can be increased.

Figure 10:
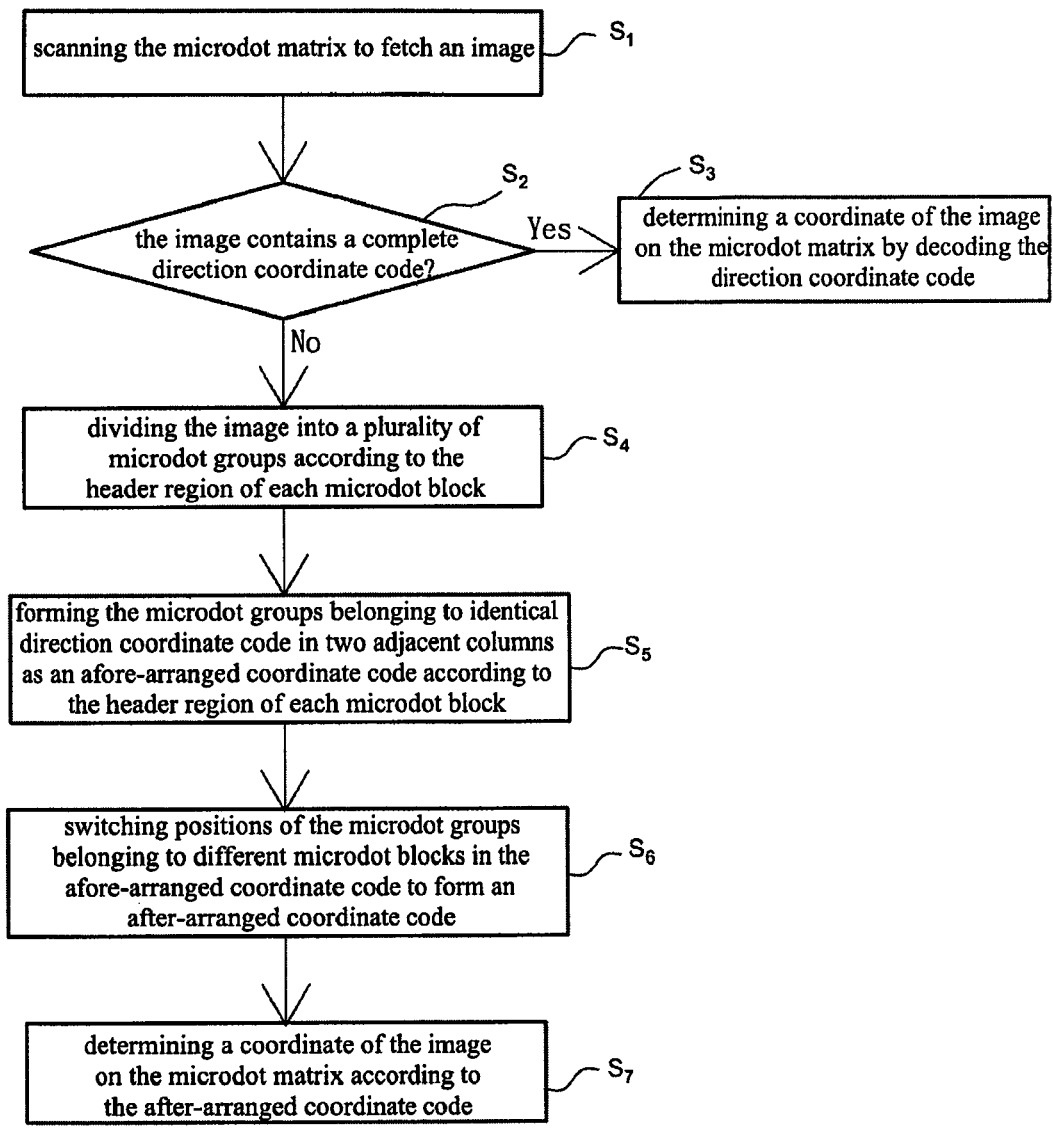
FIG. 10 shows a flow chart of a decoding method for a microdot matrix according to an embodiment of the present invention.

Please refer to FIG. 10, it shows a flow chart of the decoding method for a microdot matrix according to an embodiment of the present invention including the steps of: scanning the microdot matrix to fetch an image (Step $S_1$); recognizing whether the image contains a complete direction coordinate code (Step $S_2$); if yes, determining a coordinate of the image on the microdot matrix by decoding the direction coordinate code (Step $S_3$); if not, dividing the image into a plurality of microdot groups according to the header region of each microdot block (Step $S_4$); forming the microdot groups belonging to identical direction coordinate code in two adjacent columns as an afore-arranged coordinate code according to the header region of each microdot block (step $S_5$); switching positions of the microdot groups belonging to different microdot blocks in the afore-arranged coordinate code to form an after-arranged coordinate code (step $S_6$); and determining a coordinate of the image on the microdot matrix according to the after-arranged coordinate code (step $S_7$); wherein the step $S_7$ further includes: determining a plurality of coordinate scales between two adjacent microdot blocks according to a distance between a center of the image and the coordinate determined.

Figure 11A:
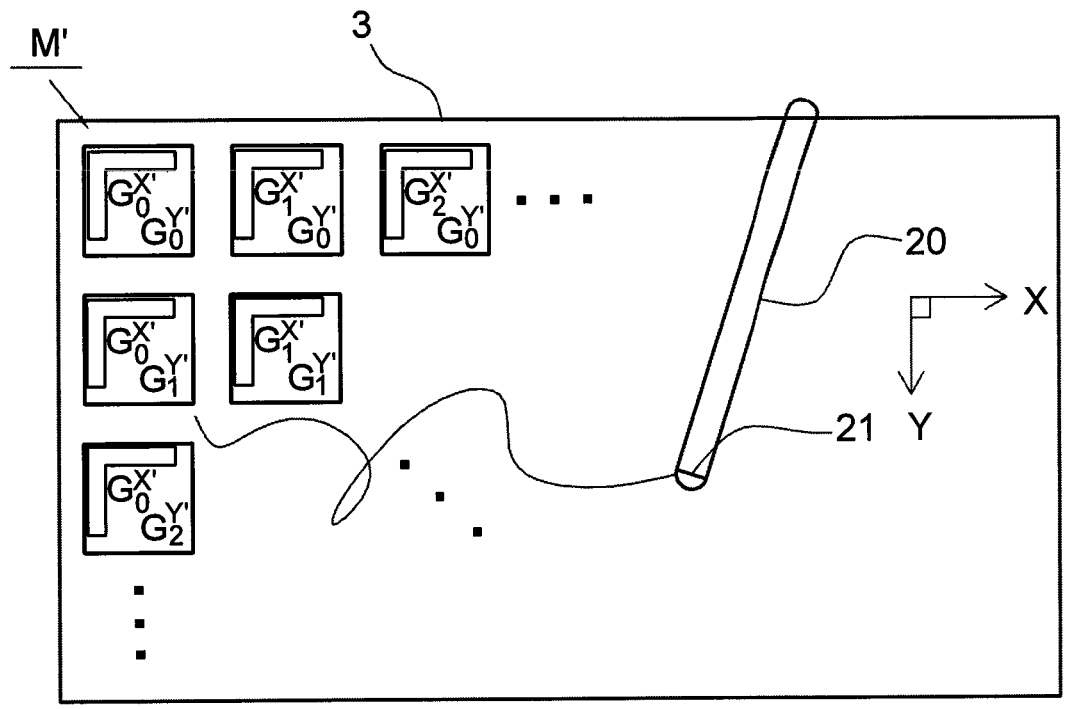
FIG. 11a shows a schematic diagram of a handwriting recognition system according to an embodiment of the present invention.
Figure 11B:
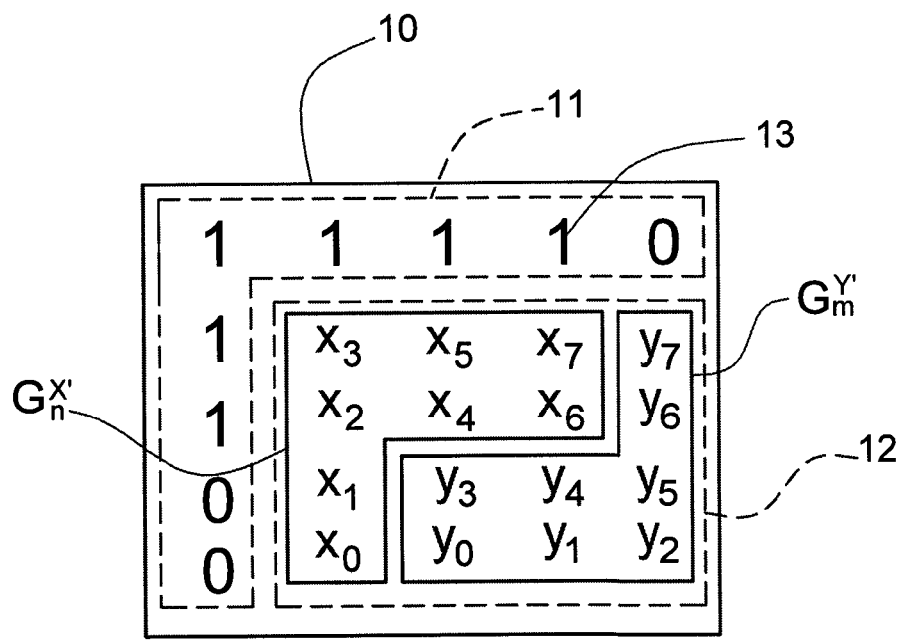
FIG. 11b shows a schematic diagram of an encoding method for a microdot matrix according to another embodiment of the present invention.

The present invention further provides an encoding and decoding method for a microdot matrix. Please refer to FIGS. 11a and 11b, the microdot matrix M' in accordance with another embodiment of the present invention also includes a plurality of microdot blocks 10 arranged as a matrix on a read/write medium 3. Each microdot block 10 also includes a header region 11 and a data region 12. The data region also includes an X-coordinate code $G_n^{X'}$ and a Y-coordinate code $G_m^{Y'}$. The difference between this embodiment and the previous embodiment is that, in this embodiment the microdots 13 corresponding to lower order bits of the Reflected Gray Codes in the X-coordinate code $G_n^{X'}$ are formed as the outmost microdots along the X-coordinate axis of the X-coordinate code $G_n^{X'}$, i.e. the leftmost or the rightmost positions in the figure; and the microdots 13 corresponding to lower order bits of the Reflected Gray Codes in the Y-coordinate code $G_m^{Y'}$ are formed as the outmost microdots along the Y-coordinate axis of the Y-coordinate code $G_m^{Y'}$, i.e. the uppermost or the lowermost positions in the figure, as shown in FIG. 11b. The reason to form the microdots 13 in this way is that the change frequency of lower order bits in the Reflected Gray Codes (i.e. changing from "0" to "1" or from "1" to "0") is much higher than that of higher order bits. In order to lower the position ambiguity during decoding, in the present embodiment the lower order bits having higher change frequency are formed as the outmost microdots along the X-coordinate axis in the X-coordinate code or along the Y-coordinate axis in the Y-coordinate code. Therefore, when the image sensor 21 fetches a partial image of a microdot block 10, the lower order bits of an X-coordinate code or a Y-coordinate code can be fetched. During decoding, the position coordinate of the image is determined as the X-coordinate code or the Y-coordinate code to which the microdot groups including lower order bits of the Reflected Gray Codes belong.

Figure 12:
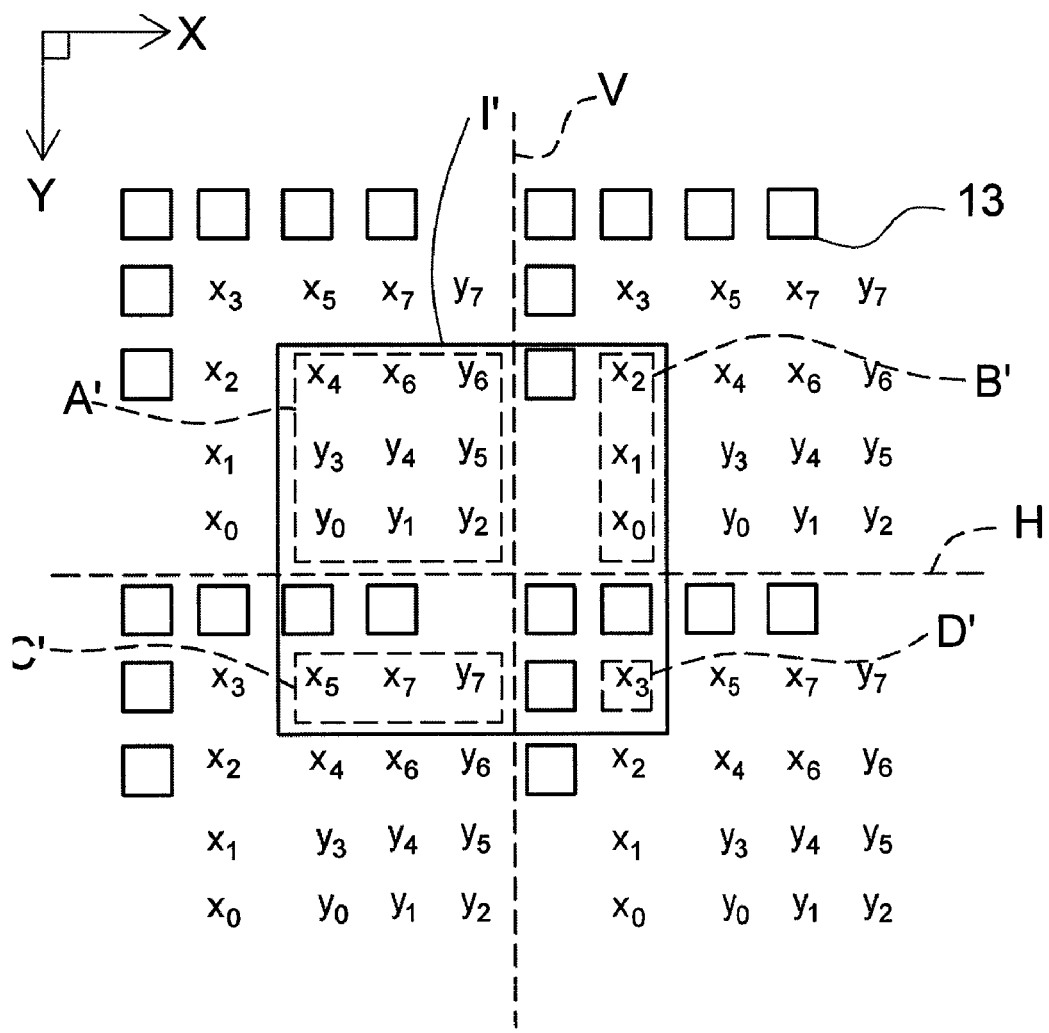
FIG. 12 shows a schematic diagram of a decoding process based on the encoding method for a microdot matrix shown in FIG. 11b.

For example in FIG. 12, the image sensor 21 fetches an image I' including the microdot groups A', B', C' and D', wherein in the X-coordinate codes $x_0$~$x_7$, since the microdot group B' includes lower order bits $x_0$~$x_2$ of the Reflected Gray Codes, the X-coordinate code of the image I' will be recognized as belonging to the microdot block 10 in the right column; in the Y-coordinate codes $y_0$~$y_7$, since the microdot group A' includes lower order bits $y_0$~$y_3$ of the Reflected Gray Codes, the Y-coordinate of the image I' will be recognized as belonging to the microdot block 10 in the upper row. In this embodiment, at last the coordinate of the image I' is recognized as belonging to the right-upper microdot block 10. In addition, in the decoding method for a microdot matrix in accordance with the present invention, a plurality of coordinate scales may be divided between two adjacent microdot blocks, as shown in FIG. 10, according to a distance between the center of the image and the coordinate to which the image belongs, and the division method was illustrated above and details will not be repeated herein.

Figure 13:
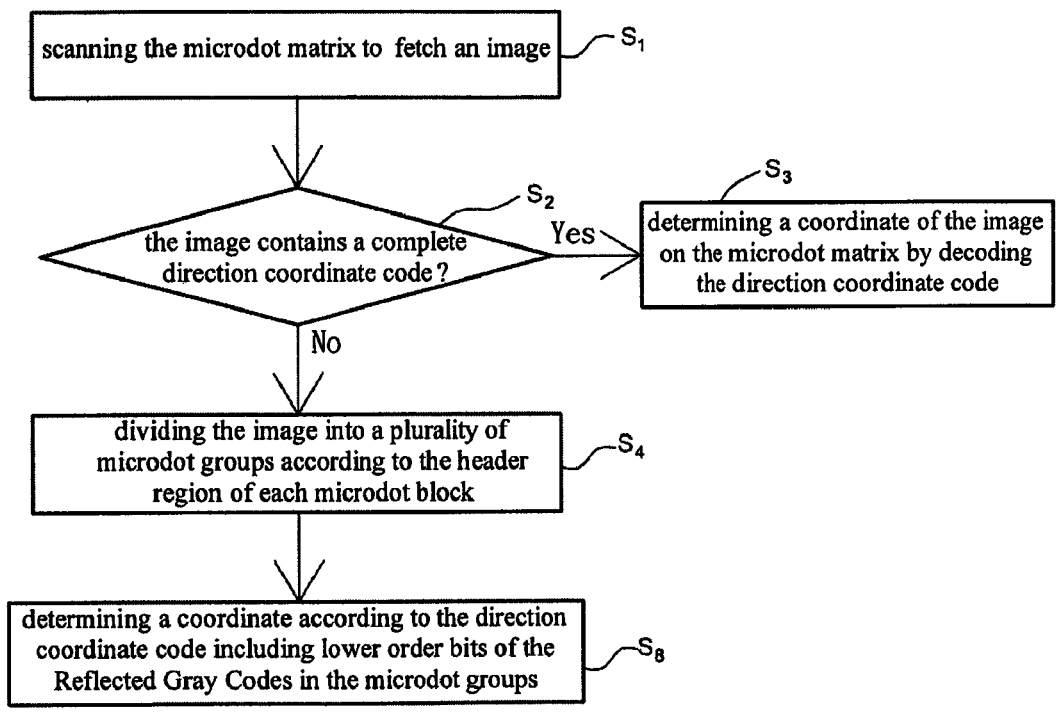
FIG. 13 shows a flow chart of a decoding method for a microdot matrix according to another embodiment of the present invention.

Therefore, the decoding method for a microdot matrix in accordance with an alternative embodiment of the present invention as shown in FIG. 13 including the steps of: scanning the microdot matrix to fetch an image (Step $S_1$); recognizing whether the image contains a complete direction coordinate code (Step $S_2$); if yes, determining a coordinate of the image on the microdot matrix by decoding the direction coordinate code (Step $S_3$); if not, dividing the image into a plurality of microdot groups according to the header region of each microdot block (Step $S_4$); and using the direction coordinate code of the microdot block to which the microdot group containing lower order bits of the Reflected Gray Codes belongs as a coordinate of the image on the microdot matrix (Step $S_8$); wherein the Step $S_8$ further includes: determining a plurality of position scales between two adjacent microdot blocks according to a distance between a center of the image and the coordinate determined. In another embodiment, in order to correct the decoded coordinate, the decoding method for a microdot matrix of the present invention further includes the step of: correcting the direction coordinate code by using the balancing microdot.

In addition, although the directions of a two-dimensional axis of the images I and I' fetched by the image sensor 21 are consistent with that of the microdot matrices M and M' in the above embodiments, the decoding process still can be performed by using the above decoding method for a microdot matrix of the present invention when an angle included between two-dimensional axes of the images I, I' and two-dimensional axes of the microdot matrices M, M' is larger than 0 degree and smaller than 180 degree. The decoding methods were illustrated above and details will not be repeated herein.

In addition, in this embodiment the distribution of the microdots 13 in the data region 12 is not limited to FIG. 10b. In the X-coordinate codes, the microdots 13 corresponding to lower order bits of the Reflected Gray Codes are formed as the outmost microdots along the X direction and the microdots 13 corresponding to higher order bits of the Reflected Gray Codes may be formed arbitrarily in the X-coordinate codes. In the Y-coordinate codes, the microdots 13 corresponding to lower order bits of the Reflected Gray Codes are formed as the outmost microdots along the Y direction and the microdots 13 corresponding to higher order bits of the Reflected Gray Codes may be disposed arbitrarily in the Y-coordinate codes. For example as shown in FIGS. 14a~14c, a direction of the X-coordinate axis is defined in the left-right direction in the figure and a direction of the Y-coordinate axis is defined in the up-down direction in the figure. However, the coordinate axes may be defined according to different embodiments in actual implementation. The microdots 13 are formed as a matrix in the X-coordinate code region and the Y-coordinate code region.

As mentioned above, as the image fetched by the image sensor of a conventional handwriting recognition system has to contain a complete position code, a larger sensor array is required and the system needs a storage device to record all position codes. Therefore, the conventional handwriting recognition system has higher system cost. The present invention encodes and decodes a microdot matrix by using the Reflected Gray Codes and the decoding of the microdot matrix can be performed according to the fixed varying regularity of the Reflected Gray Codes so as to reduce the system cost. In addition, the encoding and decoding method for a microdot matrix of the present invention can further divide finer coordinate scales according to a distance between the center of the fetched image and the coordinate of the image so as to increase the position accuracy during decoding process.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An encoding method for a microdot matrix, comprising:
in a data region comprised in each of a plurality of microdot blocks comprised in a microdot matrix, defining a first coordinate axis and a second coordinate axis of the microdot matrix;
dividing the data region of each microdot block into a first coordinate code region and a second coordinate code region; and
respectively encoding a first coordinate code and a second coordinate code by encoding based on Reflected Gray Codes according to a position of each microdot block on the microdot matrix, and forming a plurality of microdots in the first coordinate code region and the second coordinate code region according to the encoded first coordinate code and second coordinate code;
wherein the first coordinate code corresponds to a coordinate of the first coordinate axis of the microdot block on the microdot matrix while the second coordinate code corresponds to a coordinate of the second coordinate axis of the microdot block on the microdot matrix;
wherein the microdots corresponding to lower order bits of the Reflected Gray Codes are formed as the outmost microdots in the data region.

2. The encoding method as claimed in claim 1, wherein the data region of each of the microdot blocks has N×N microdots, and the N microdots at one side of the data region are the microdots corresponding to lower order bits of the Reflected Gray Codes.

3. The encoding method as claimed in claim 1, wherein the microdots corresponding to lower order bits of the Reflected Gray Codes are formed as the outmost microdots along a direction of the first coordinate axis in the first coordinate code region; and the microdots corresponding to lower order bits of the Reflected Gray Codes are formed as the outmost microdots along a direction of the second coordinate axis in the second coordinate code region.

4. The encoding method as claimed in claim 1, wherein the data region of each of the microdot blocks has N×N microdots, and the N microdots at one side of the data region are the microdots corresponding to lower order bits of the Reflected Gray Codes in the first coordinate code or the second coordinate code.

5. The encoding method as claimed in claim 1, wherein the microdot block further comprises a header region comprising header microdots distributed in a fixed combination and permutation and a balancing microdot representing a coordinate value of different directions.

6. The encoding method as claimed in claim 1, wherein the microdots in the data region are formed as a matrix in the date region.

7. A decoding method for a microdot matrix, the microdot matrix comprising a plurality of microdot blocks, a plurality of microdots being formed by encoding based on Reflected Gray Codes to form at least one direction coordinate code in a data region comprised in the microdot block, the microdots corresponding to lower order bits of the Reflected Gray Codes being formed as the outmost microdots in the data region, the decoding method comprising the steps of:
scanning the microdot matrix to fetch an image and recognizing a microdot group in the date region of each of the microdot blocks in the image; and
decoding a coordinate of the image on the microdot matrix according to the microdot block to which the microdot group containing lower order bits of the Reflected Gray Codes belongs.

8. The decoding method as claimed in claim 7, wherein the direction coordinate code comprises a first coordinate code and a second coordinate code, and in the step of decoding a coordinate of the image on the microdot matrix according to the microdot block to which the microdot group containing lower order bits of the Reflected Gray Codes belongs further comprises the steps of:
decoding a first coordinate of the image on the microdot matrix according to the first coordinate code of the microdot block to which the microdot group containing lower order bits of the Reflected Gray Codes belongs; and
decoding a second coordinate of the image on the microdot matrix according to the second coordinate code of the microdot block to which the microdot group containing lower order bits of the Reflected Gray Codes belongs.

9. The decoding method as claimed in claim 8, further comprising: defining a first coordinate axis and a second coordinate axis perpendicular to the first coordinate axis of the microdot matrix, wherein the first coordinate corresponds to the first coordinate axis and the second coordinate corresponds to the second coordinate axis.

10. The decoding method as claimed in claim 9, wherein the microdots corresponding to lower order bits of the Reflected Gray Codes are formed as the outmost microdots along a direction of the first coordinate axis in the first coordinate code; and the microdots corresponding to lower order bits of the Reflected Gray Codes are formed as the outmost microdots along a direction of the second coordinate axis in the second coordinate code.

11. The decoding method as claimed in claim 7, wherein the microdot block further comprises a header region in which a balancing microdot representing a coordinate value of different directions is formed, and the decoding method further comprises: correcting the direction coordinate code with the balancing microdot.

12. The decoding method as claimed in claim 7, further comprising: determining a plurality of coordinate scales between two adjacent microdot blocks according to a distance between a center of the image and the coordinate decoded.

13. The decoding method as claimed in claim 7, wherein in the step of scanning the microdot matrix to fetch an image and recognizing a microdot group in the date region of each of the microdot blocks in the image further comprises the steps of:
  scanning the microdot matrix to fetch an image;
  recognizing whether the image contains a complete direction coordinate code;
  determining a coordinate of the image on the microdot matrix by decoding the direction coordinate code when the image contains a complete direction coordinate code;
  performing the following steps when the image does not contain a complete direction coordinate code:
    dividing the image into a plurality of microdot groups according to the header region of each of the microdot blocks and recognizing the microdot group in the date region of each microdot block in the image.

14. An encoding and decoding method for a microdot matrix, comprising the steps of:
  forming a plurality of microdots by encoding based on Reflected Gray Codes in a data region comprised in each of a plurality of microdot blocks comprised in a microdot matrix, wherein the microdots corresponding to lower order bits of the Reflected Gray Codes are formed as the outmost microdots in the data region;
  scanning the microdot matrix to fetch an image and recognizing a microdot group in the date region of each of the microdot blocks in the image; and
  decoding a coordinate of the image on the microdot matrix according to the microdot block to which the microdot group containing lower order bits of the Reflected Gray Codes belongs.

15. The encoding and decoding method as claimed in claim 14, further comprising: determining a plurality of coordinate scales between two adjacent microdot blocks according to a distance between a center of the image and the coordinate decoded.

16. The encoding and decoding method as claimed in claim 14, wherein in the step of forming a plurality of microdots by encoding based on Reflected Gray Codes in a data region comprised in each of a plurality of microdot blocks comprised in a microdot matrix further comprises the steps of:
  defining a first coordinate axis and a second coordinate axis of the microdot matrix;
  dividing the data region of each of the microdot blocks into a first coordinate code region and a second coordinate code region; and
  respectively encoding a first coordinate code and a second coordinate code by encoding based on Reflected Gray Codes according to a position of each the microdot block on the microdot matrix, and forming the microdots corresponding to lower order bits of the Reflected Gray Codes in the first coordinate code and the second coordinate code as the outmost microdots in the first coordinate code region and the second coordinate code region, respectively.

17. The encoding and decoding method as claimed in claim 16, wherein in the step of decoding a coordinate of the image on the microdot matrix according to the microdot block to which the microdot group containing lower order bits of the Reflected Gray Codes belongs further comprises the steps of:
  decoding a coordinate of a first coordinate axis of the image on the microdot matrix according to the first coordinate code of the microdot block to which the microdot group containing lower order bits of the Reflected Gray Codes belongs; and
  decoding a coordinate of a second coordinate axis of the image on the microdot matrix according to the second coordinate code of the microdot block to which the microdot group containing lower order bits of the Reflected Gray Codes belongs.

18. The encoding and decoding method as claimed in claim 14, further comprising the steps of:
  forming a balancing microdot representing a coordinate value of different directions in a header region comprised in each of the plurality of microdot blocks comprised on the microdot matrix; and
  correcting the coordinate decoded with the balancing microdot.

19. The encoding and decoding method as claimed in claim 14, wherein the microdots in the data region are formed as a matrix in the date region.

20. An encoding method for a microdot matrix, comprising:
  in a data region comprised in each of a plurality of microdot blocks comprised in a microdot matrix, respectively encoding a first coordinate and a second coordinate based on Reflected Gray Codes and forming a plurality of microdots in a first coordinate code region and a second coordinate code region comprised in the data region comprised in each the microdot block according to a first coordinate axis and a second coordinate axis used by the microdot matrix and according to a coordinate of each the microdot block on the microdot matrix;
  wherein the first coordinate axis is perpendicular to the second coordinate axis, the coordinate of each the microdot block on the microdot matrix is determined by the first coordinate and the second coordinate, and the first coordinate corresponds to the first coordinate axis and the second coordinate corresponds to the second coordinate axis.

* * * * *